US010176286B1

(12) United States Patent
Goyal et al.

(10) Patent No.: US 10,176,286 B1
(45) Date of Patent: Jan. 8, 2019

(54) SYSTEM, METHOD, AND COMPUTER PROGRAM PRODUCT FOR OSCILLATING LOOP DETECTION IN FORMAL VERIFICATION

(71) Applicant: Cadence Design Systems, Inc., San Jose, CA (US)

(72) Inventors: Pradeep Goyal, Uttar Pradesh (IN); Ravindra Kumar, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 28 days.

(21) Appl. No.: 15/462,161

(22) Filed: Mar. 17, 2017

(51) Int. Cl.
*G06F 17/50* (2006.01)

(52) U.S. Cl.
CPC .................. *G06F 17/504* (2013.01)

(58) Field of Classification Search
CPC .................................... G06F 17/504
USPC ....................................... 716/102
See application file for complete search history.

(56) References Cited

U.S. PATENT DOCUMENTS

| 6,367,057 | B1 * | 4/2002 | Parashkevov | G06F 17/5022 |
| | | | | 716/103 |
| 6,745,160 | B1 * | 6/2004 | Ashar | G06F 17/504 |
| | | | | 703/13 |
| 7,073,141 | B2 * | 7/2006 | Novakovsky | G06F 17/5022 |
| | | | | 716/103 |
| 2007/0143717 | A1 * | 6/2007 | Koelbl | G06F 17/504 |
| | | | | 716/103 |
| 2016/0224710 | A1 * | 8/2016 | Dua | G06F 17/5045 |

OTHER PUBLICATIONS

Malik, S., "Analysis of Cyclic Combinational Circuits", Proceedings of the IEEE Transactions on Computer-Aided Design, pp. 618-625, 1993.
Namjoshi, K. S. et al., "Efficient Analysis of Cyclic Definitions", CAV 1999, LNCS 1633, pp. 394-405, 1999.
Shiple, T. R., et al., "Constructive Analysis of Cyclic Circuits", European Design and Test Conference, 6 pages, 1996.

* cited by examiner

*Primary Examiner* — Suresh Memula
(74) *Attorney, Agent, or Firm* — Mark H. Whittenberger, Esq.; Holland & Knight LLP

(57) ABSTRACT

The present disclosure relates to a computer-implemented method for electronic design verification. The method may include receiving, using a processor, an electronic design having a plurality of loops and removing a section of each of the plurality of loops. The method may further include obtaining an input/output net for each of the plurality of loops and generating a copy of at least a portion of the electronic design. The method may include connecting all inputs except a loop cut input net associated with the removed section and analyzing a loop output net using formal verification.

20 Claims, 8 Drawing Sheets

SYSTEM, METHOD, AND COMPUTER PROGRAM PRODUCT FOR OSCILLATING LOOP DETECTION IN FORMAL VERIFICATION

FIELD OF THE INVENTION

The present disclosure relates to electronic design verification, and more specifically, to a method for oscillating loop detection associated with electronic design verification.

DISCUSSION OF THE RELATED ART

In the electronic design automation ("EDA") field, a combinational loop may refer to a structure that is formed by a signal starting from an input of a combinational gate, after passing through one or more combinational gates, reaches the same gate from which it started without encountering any sequential element in between. Combinational loops may be used to meet design parameters such as shared datapath operators to reduce area. In some cases combinational loops might be present due to the presence of master-slave latches in the design. Such combinational loops are typically false loops, for example, in situations where signal values do not propagate through the entire loop. However, RTL designs may also have true combinational loops, where the signal values do propagate through the entire loop. True combinational loops can be a source of functional, power and manufacturing problems.

SUMMARY OF DISCLOSURE

In one or more embodiments of the present disclosure, a computer-implemented method for electronic design verification is provided. The method may include receiving, using a processor, an electronic design having a plurality of loops and removing a section of each of the plurality of loops. The method may further include obtaining an input/output net for each of the plurality of loops and generating a copy of at least a portion of the electronic design. The method may include connecting all inputs except a loop cut input net associated with the removed section and analyzing a loop output net using formal verification.

One or more of the following features may be included. In some embodiments, generating the copy may include generating two copies. Analyzing may be based upon, at least in part, a miter. If analyzing is successful an oscillating loop may be detected. If analyzing is unsuccessful a false loop or stable loop may be detected. Analyzing may include checking for a miter value. The method may further include inverting an I/O value set in the copy, based upon, at least in part, an I/O value set in an original loop.

In one or more embodiments of the present disclosure a computer-readable storage medium having stored thereon instructions, which when executed by a processor result in one or more operations is provided. Operations may include receiving, using a processor, an electronic design having a plurality of loops and removing a section of each of the plurality of loops. Operations may further include obtaining an input/output net for each of the plurality of loops and generating a copy of at least a portion of the electronic design. Operations may include connecting all inputs except a loop cut input net associated with the removed section and analyzing a loop output net using formal verification.

One or more of the following features may be included. In some embodiments, generating the copy may include generating two copies. Analyzing may be based upon, at least in part, a miter. If analyzing is successful an oscillating loop may be detected. If analyzing is unsuccessful a false loop or stable loop may be detected. Analyzing may include checking for a miter value. Operations may further include inverting an I/O value set in the copy, based upon, at least in part, an I/O value set in an original loop.

In one or more embodiments of the present disclosure, a system for electronic design verification is provided. The system may include at least one processor configured to receive an electronic design having a plurality of loops and to remove a section of each of the plurality of loops. The at least one processor may be further configured to obtain an input/output net for each of the plurality of loops and to generate a copy of at least a portion of the electronic design. The at least one processor may be further configured to connect all inputs except a loop cut input net associated with the removed section and to analyze a loop output net using formal verification.

One or more of the following features may be included. In some embodiments, generating the copy may include generating two copies. Analyzing may be based upon, at least in part, a miter. If analyzing is successful an oscillating loop may be detected. If analyzing is unsuccessful a false loop or stable loop may be detected. Analyzing may include checking for a miter value. The at least one processor may be further configured to invert an I/O value set in the copy, based upon, at least in part, an I/O value set in an original loop.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
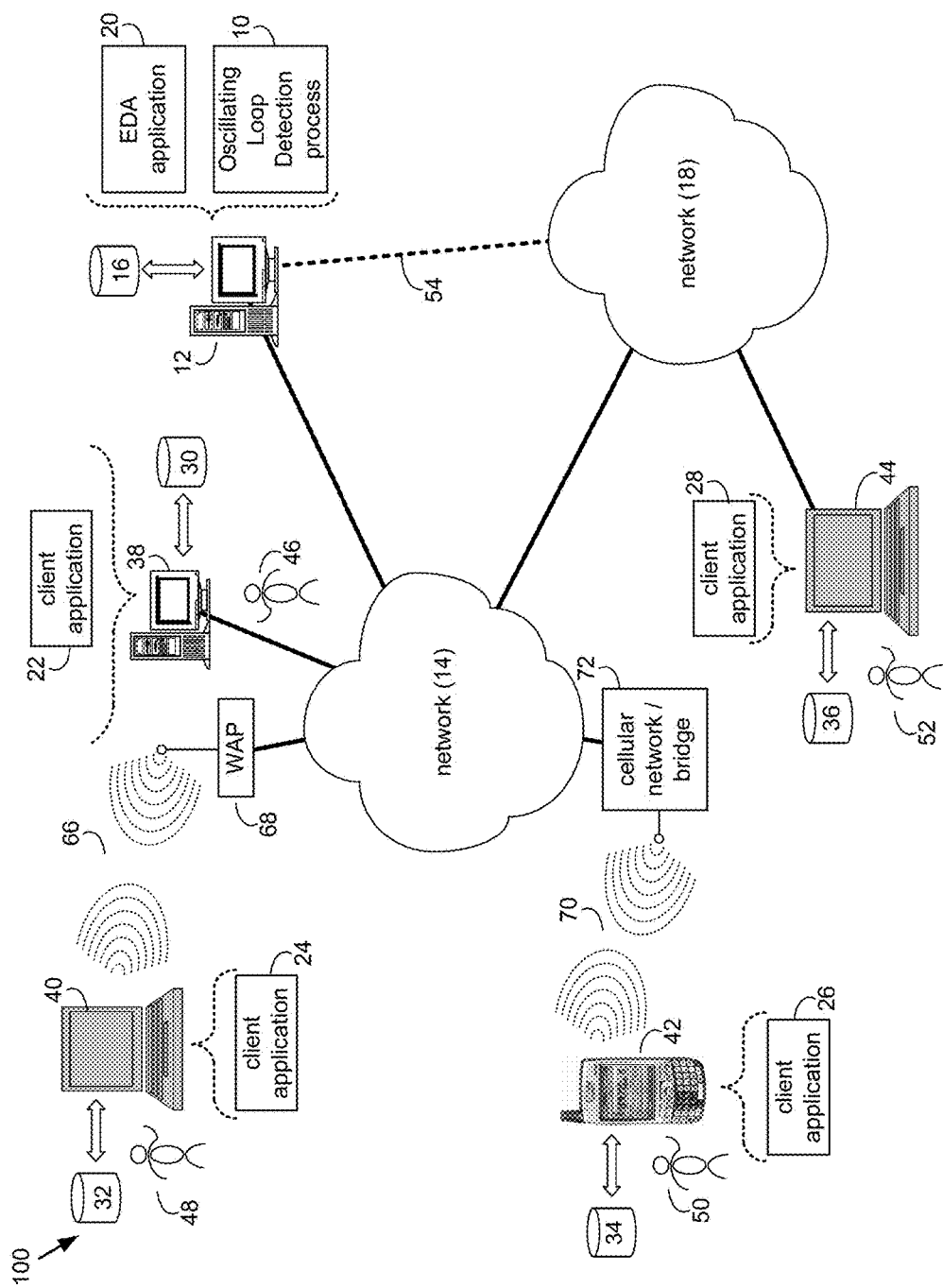
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosure. Some hardware description languages may include, but are not limited to, Verilog, VHDL, SystemC, SystemVerilog and Verilog-AMS. Various other hardware description languages may also be used as well.

Referring to FIG. 1, there is shown a oscillating loop detection process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, oscillating loop detection process 10 may reside on and be executed, in whole or in part, by a client electronic device, such as a personal computer, notebook computer, personal digital assistant, or the like.

The instruction sets and subroutines of oscillating loop detection process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Oscillating loop detection process 10 may be a stand alone application, or may be an applet/application/script that may interact with and/or be executed within EDA application 20. In addition/as an alternative to being a server-side process, oscillating loop detection process 10 may be a client-side process (not shown) that may reside on a client electronic device (described below) and may interact with an EDA client application (e.g., one or more of EDA client applications 22, 24, 26, 28). Further, oscillating loop detection process 10 may be a hybrid server-side/client-side process that may interact with EDA application 20 and an EDA client application (e.g., one or more of client applications 22, 24, 26, 28). As such, oscillating loop detection process 10 may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize oscillating loop detection process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.).

Figure 2:
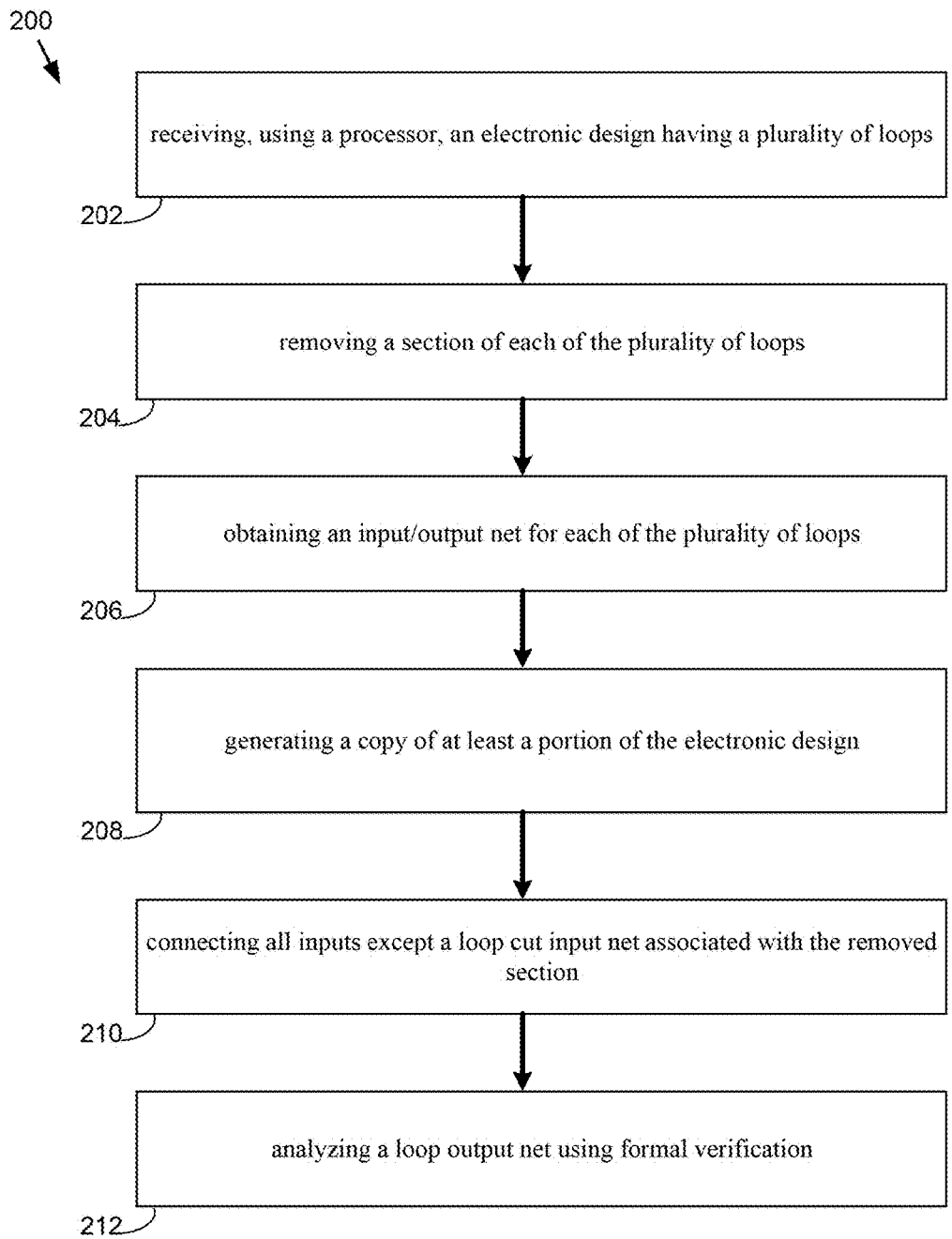
FIG. 2 is a flowchart depicting operations consistent with the oscillating loop detection process in accordance with an embodiment of the present disclosure.

Referring now to FIG. 2, an exemplary flowchart 200 depicting operations consistent with oscillating loop detection process 10 is provided. Operations may include receiving (202), using a processor, an electronic design having a plurality of loops and removing (204) a section of each of the plurality of loops. The method may further include obtaining (206) an input/output net for each of the plurality of loops and generating (208) a copy of at least a portion of the electronic design. The method may include connecting (210) all inputs except a loop cut input net associated with the removed section and analyzing (212) a loop output net using formal verification.

Embodiments of oscillating loop detection process 10 may be configured to detect the presence of oscillating loops in a hardware design using formal verification. As used herein, the phrase "combinational loop" may refer to a structure that is formed by a signal starting from an input of a combinational gate, after passing through one or more combinational gates, reaches the same gate from which it started without encountering any sequential element in between.

In some embodiments, combinational loops may be used to meet design parameters such as shared datapath operators to reduce area. In some cases combinational loops might be present due to the presence of master-slave latches in the design. Such combinational loops are typically false loops, for example, in situations where signal values do not propagate through the entire loop. However, RTL designs may also have true combinational loops, where the signal values do propagate through the entire loop. True combinational loops can be a source of functional, power and manufacturing problems. There are two types of true combinational loops—stable and oscillating loops. The nets in a stable combinational loop settle down to fixed Boolean values. The stable combinational loop acts as some form of a memory element. On the other hand, the nets in an oscillating combinational loop do not settle down and keep on toggling. Traditional formal techniques in logic synthesis, logic analysis and timing analysis of combinational circuits have restricted themselves to acyclic combinational circuits since they have been unable to handle the analysis of circuits with loops. Thus, in practice, these circuits are typically handled using clumsy workarounds, which is obviously undesirable.

Embodiments of oscillating loop detection process 10 may be configured to handle false and stable loops during formal verification without losing the design intent. In some embodiments, this may involve applying a cut on every loop and thus generating two nets which can then be joined back using an assumption. However, if this scheme is applied in the presence of oscillating loops, the results from formal verification can go wrong. As such, the challenge lies in identifying the presence of oscillating loops in the electronic design as is discussed in detail hereinbelow. Additionally and/or alternatively, the process may allow a user to simply cut all the structural loops and proceeds with formal verification. However, applying a cut may lead to pessimistic analysis of the design by formal verification.

Some users tend to use tinting to identify combinational loops in their designs. Tinting tools would identify the structural combinational loop in the design. These loops can be functionally false loops. For functional loop detection using formal verification, there has been some research already done: [1] S. Malik: Analysis of Cyclic Combinational Circuits," IEEE Transactions on Computer-Aided Design, Vol. 13, No. 7, pp. 950-956, 1994; [2] Kedar S. Namjoshi and Robert P. Kurshan: "Efficient Analysis of Cyclic Definitions" CAV 2001; and [3] T. Shiple, G. Berry and H. Touati: "Constructive Analysis of Cyclic Circuits", European Design and Test Conference, 1996.

In some embodiments, oscillating loop detection process 10 may be configured to use formal verification to differentiate between true loops and false loops. In simulation technology, the presence of an oscillating loop may be inferred if the event activity is extremely high on a certain design region. However, such a simulation may require a testbench that should activate the oscillating loop.

Current formal verification based implementations are able to distinguish between true combinational loops and false combinational loops. However, these approaches are not capable of distinguishing between stable and oscillating loops. Without losing the original design intent, formal verification may only be accomplished if only false or stable loops are present. In some cases, the hardware circuit may be remodeled so that the underlying engines provide the correct verification results. However, if the same remodeling is done in the presence of oscillating loops, the results may be incorrect. Accordingly, identification of oscillating loops is necessary to proceed on the assertion-based formal verification in the presence of combinational loops.

As such, embodiments of oscillating loop detection process 10 may use formal verification and may distinguish between stable and oscillating loops. Formal verification ensures that it would detect if there is any scenario where the oscillating loop can be activated. The detection of oscillating loops not only helps a designer isolate a critical design bug but also helps formal verification run smoothly on the designs having combinational loops.

Figure 3:
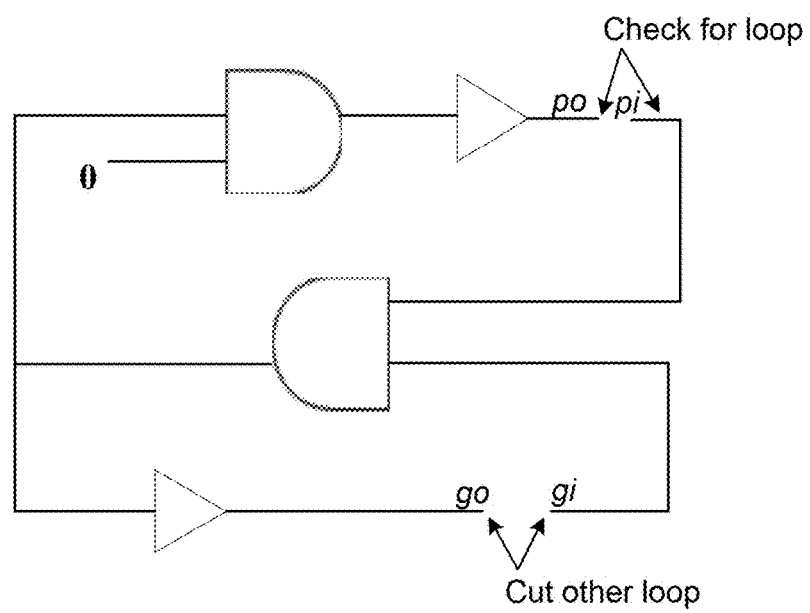
FIG. 3 is a diagram depicting an example of an oscillating loop detection process in accordance with the present disclosure.

Referring now to FIGS. 3-8, embodiments of oscillating loop detection process 10 are provided. For oscillating loop detection, the present disclosure may be configured to avoid the complexity of interacting loops. Accordingly, embodiments included herein may be applied for one loop and pessimistically "cut" all other loops. In this way, operations included herein may be applied on all the loops one by one (or together) using a symbolic constant. When a loop is cut at any arbitrary point, it may result in two input/output nets shown as pi/pi pair or go/gi pair as is shown in FIG. 3.

Figure 4:
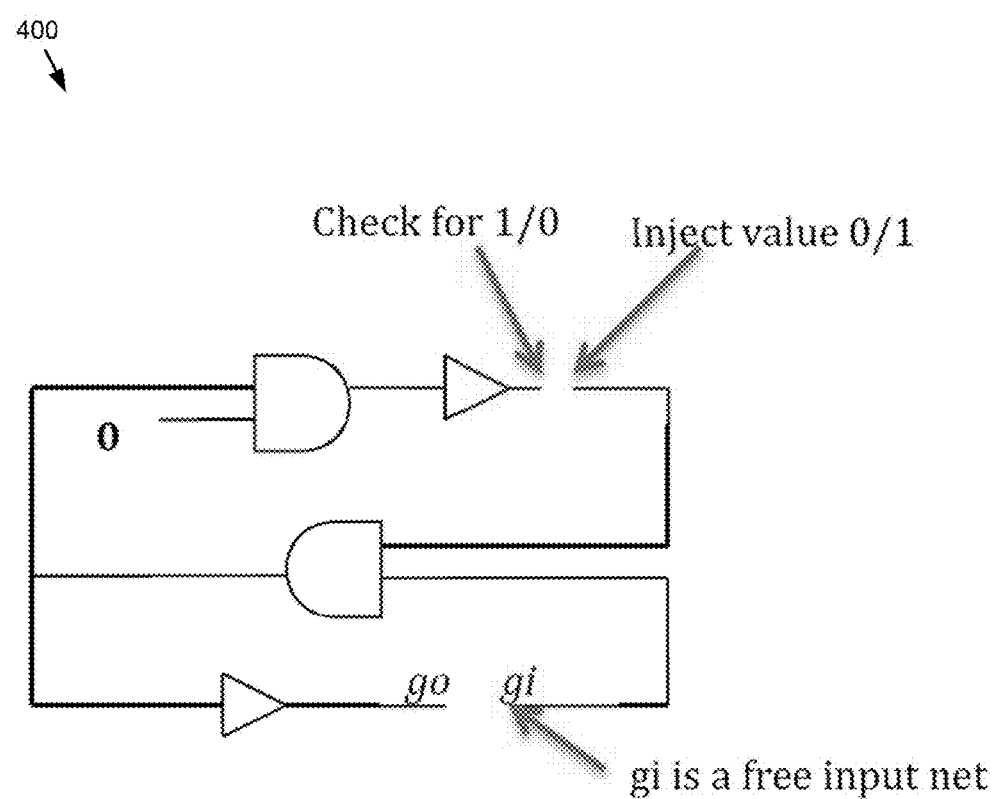
FIG. 4 is a diagram depicting an example of an oscillating loop detection process in accordance with the present disclosure.

Referring also to FIG. 4, another embodiment consistent with oscillating loop detection process 10 is provided. In this example, formal verification may be used to inject a value of "1" at the input side of the cut and check for a "0" value at the output net of the loop. In some embodiments, the process may be configured to ensure that the injection and checking is done in the same time stamp. Since, checking for only one specific value is not enough embodiments included herein may be configured to check for injecting a "0" value at the input and checking for a "1" value at the other end of loop cut as well. This may be referred to as the Boolean difference approach an example of which is shown in FIG. 4.

Figure 5:
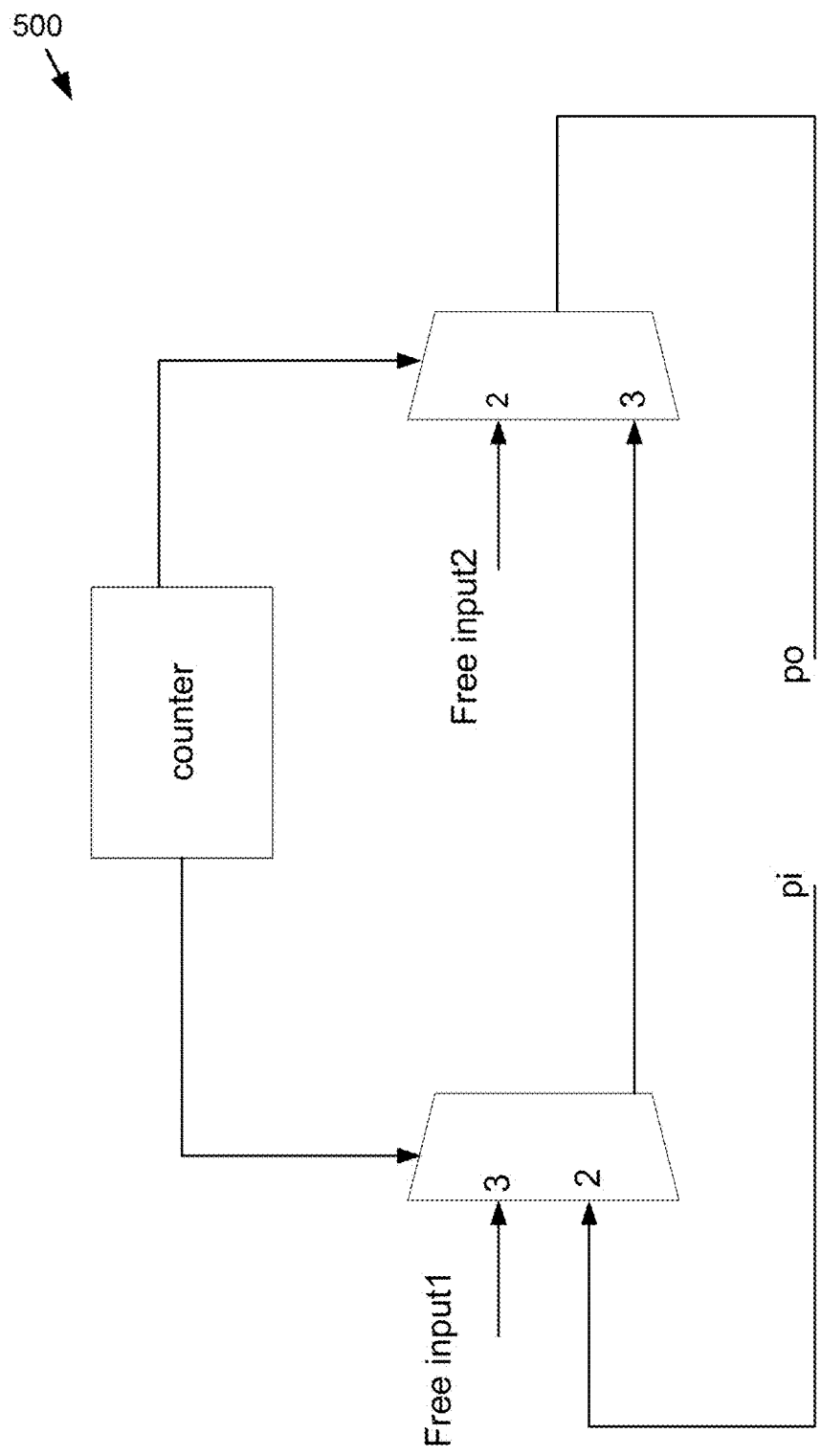
FIG. 5 is a diagram depicting an example of an oscillating loop detection process in accordance with the present disclosure.

This approach is not sufficient as the 0→1 loop can happen at one point of time and the 1→0 loop may happen at some other time. FIG. 5 shows this problem in a sample design. The example shown in FIG. 5 is a false combinational loop. In this particular example when "pi" is injected a value of "0", there could be a situation with a counter value of "2" (e.g., after 2 run cycles) and the value "0" may propagate through the left multiplexer. However, with a counter value of "2", the right multiplexer would read free input2 value. The run may then choose a value of "1" for the free input and "po" may read value "1" satisfying the condition. Also, when "pi" is injected with a value of "1", there could be a case with a counter value of "3" (e.g., after 3 run cycles) and free input1 is propagated. The run would choose a value of "0" which would then propagate through the right multiplexer and "po" would read value "0". Since both the conditions are satisfied, with this example a false loop may be specified as an oscillating loop. As such, embodiments of the present disclosure may be configured to check for 0→1 loop and 1→0 loop at the same point of time. If the formal engine returns a way for 0→1 loop at time "T", embodiments of the present disclosure may be configured to check for 1→0 also for time "T" itself.

However, even this approach may not be adequate because the 0→1 loop may occur for one set of input values and the 1→0 loop may occur for another set of input values as is shown in FIG. 5. For a "pi" value of "0", after 2 cycles (e.g., a counter=2), the left multiplexer would propagate a value of "0", however, the right multiplexer would choose a value of "1" for free input2 and "po" would read value 1. Similarly, for a "pi" value of "1", after 2 cycles (e.g., counter=2), the left multiplexer would propagate value "1", however, the right multiplexer would choose a value of "0" for free input2 and "po" would read value "0". Accordingly, at the same time (e.g., 2 run cycles), both 0→1 and 1→0 loops are feasible. Again, this would result in a false analysis.

Figure 6:
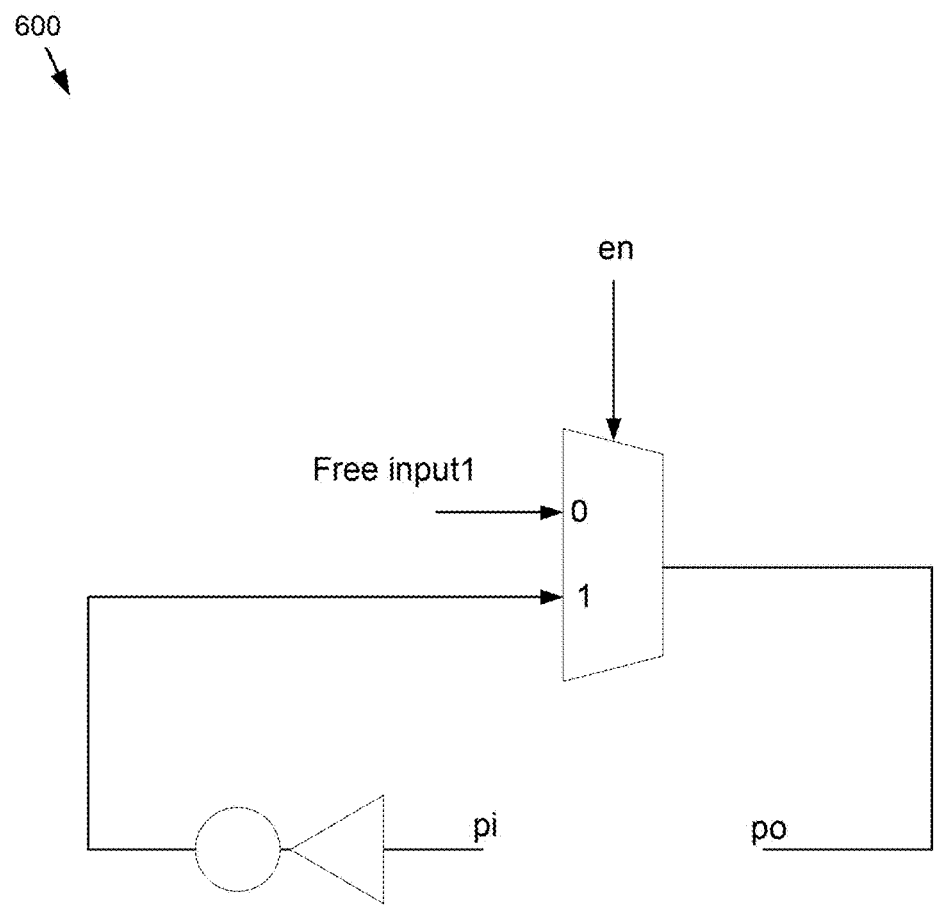
FIG. 6 is a diagram depicting an example of an oscillating loop detection process in accordance with the present disclosure.

In some embodiments, oscillating loop detection process 10 may be configured to detect a 0→1 and a 1→0 transition on the loop input/output nodes at the same time instance "T" and for the same external input values for the entire run. As shown in FIG. 6, in this embodiment oscillating loop detection process 10 may check for 0→1 and 1→0 loop for the same value of "en" and "Free input1" and at same time "T".

Figure 7:
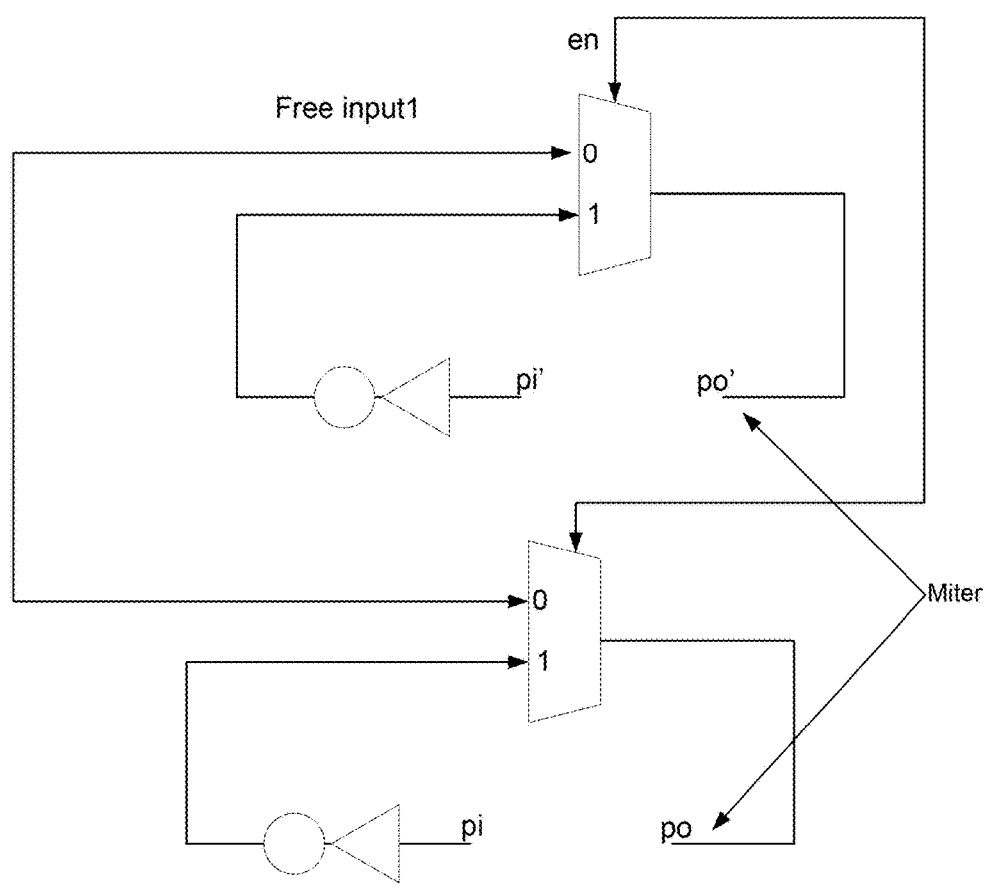
FIG. 7 is a diagram depicting an example of an oscillating loop detection process in accordance with the present disclosure.
Figure 8:
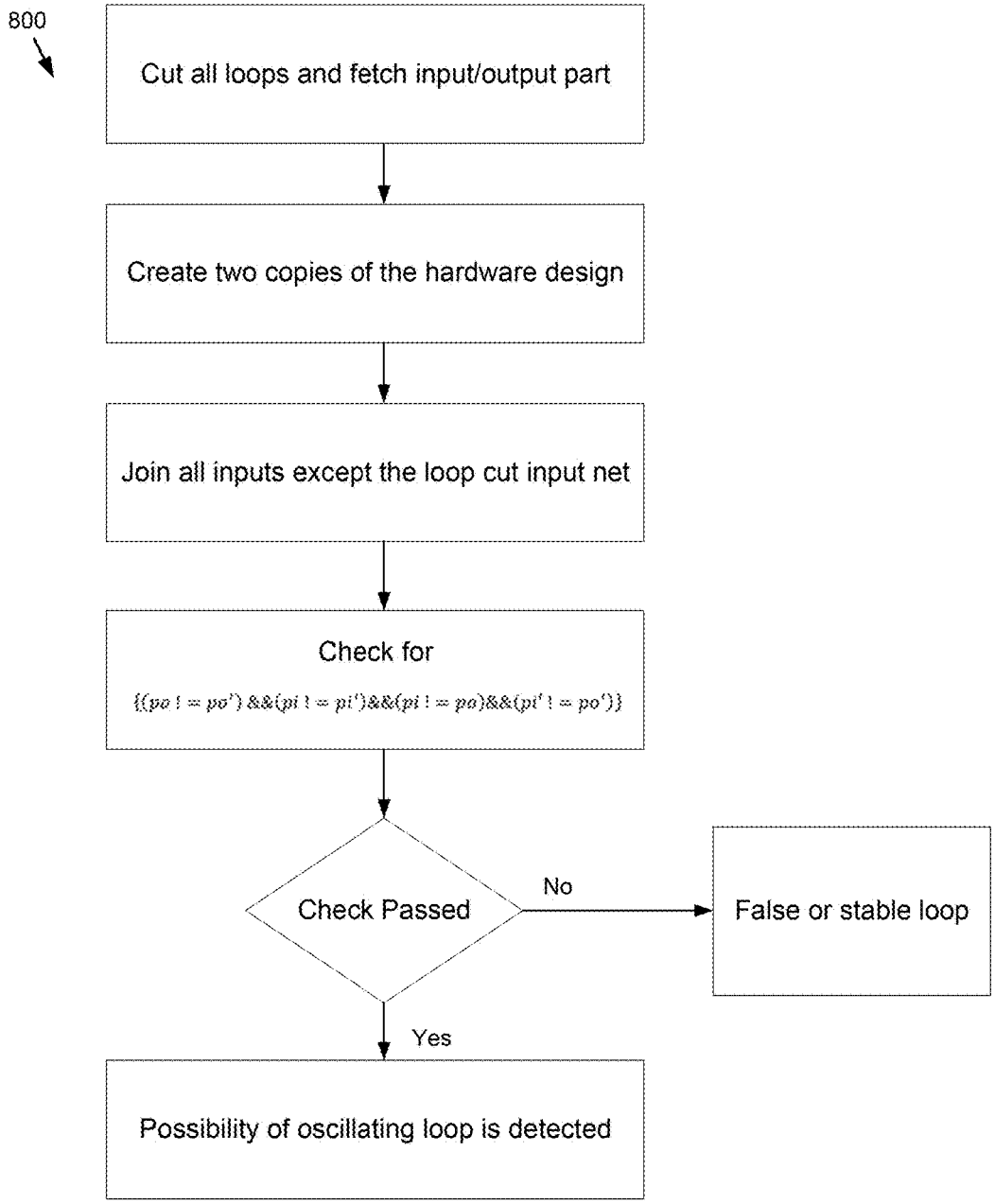
FIG. 8 is a flowchart depicting operations consistent with the oscillating loop detection process in accordance with an embodiment of the present disclosure.

Embodiments of oscillating loop detection process 10 may provide an easy mechanism to achieve this task by tweaking the design slightly and using formal verification methods. As shown in FIG. 7, embodiments of oscillating loop detection process 10 may create two copies of the design circuitry and may also join all the corresponding input nets of the two circuits except the loop input net on which the check is being applied. In some embodiments, a miter (XOR) may be added at the loop output net and the process may be configured to check for a value of "1" for the miter using formal verification. A value of "1" for the miter would mean different output net values in the two copies.

In some embodiments, oscillating loop detection process 10 may ensure that the input/output values are inversed in each individual copy. For example, and as shown in FIG. 7, if pi and pi' are chosen as "0" and "1", po and po' should be "1" and "0" and vice versa. This inversion check of input/output values in the corresponding copy may be used to differentiate oscillating loop from the stable loops.

Referring again to FIG. 8, a flowchart depicting an embodiment consistent with oscillating loop detection process 10 is provided. In operation, the process may cut all loops and fetch input/output part. In some embodiments, the system may include creating at least one copy of the hardware design and joining all inputs except the loop cut input net. Oscillating loop detection process 10 may check for {(po!=po')&&(pi!=pi')&&(pi!=po)&&(pi'!=po')}

If the check does not pass it may indicate the presence of a false or stable loop. However, if the check does pass then a possible oscillating loop is detected.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for electronic design verification comprising:
  receiving, using a processor, an electronic design having a plurality of loops;
  removing a section of each of the plurality of loops;
  obtaining an input/output net for each of the plurality of loops;
  generating a copy of at least a portion of the electronic design;
  connecting all inputs except a loop cut input net associated with the removed section; and
  analyzing a loop output net using formal verification.

2. The computer-implemented method of claim 1, wherein generating the copy includes generating two copies.

3. The computer-implemented method of claim 1, wherein analyzing is based upon, at least in part, a miter.

4. The computer-implemented method of claim 1, wherein if analyzing is successful an oscillating loop is detected.

5. The computer-implemented method of claim 1, wherein if analyzing is unsuccessful a false loop or stable loop is detected.

6. The computer-implemented method of claim 3, wherein analyzing includes checking for a miter value.

7. The computer-implemented method of claim 1, further comprising:
  inverting an I/O value set in the copy, based upon, at least in part, an I/O value set in an original loop.

8. A non-transitory computer-readable storage medium for electronic design verification, the computer-readable storage medium having stored thereon instructions that when executed by a machine result in one or more operations, the operations comprising:
  receiving, using a processor, an electronic design having a plurality of loops;
  removing a section of each of the plurality of loops;
  obtaining an input/output net for each of the plurality of loops;
  generating a copy of at least a portion of the electronic design;
  connecting all inputs except a loop cut input net associated with the removed section; and
  analyzing a loop output net using formal verification.

9. The computer-readable storage medium of claim 8, wherein generating the copy includes generating two copies.

10. The computer-readable storage medium of claim 8, wherein analyzing is based upon, at least in part, a miter.

11. The computer-readable storage medium of claim 8, wherein if analyzing is successful an oscillating loop is detected.

12. The computer-readable storage medium of claim 8, wherein if analyzing is unsuccessful a false loop or stable loop is detected.

13. The computer-readable storage medium of claim 10, wherein analyzing includes checking for a miter value.

14. The computer-readable storage medium of claim 8, further comprising:
  inverting an I/O value set in the copy, based upon, at least in part, an I/O value set in an original loop.

15. A system for electronic design verification comprising:
   a computing device having at least one processor configured to receive an electronic design having a plurality of loops and to remove a section of each of the plurality of loops, the at least one processor further configured to obtain an input/output net for each of the plurality of loops and to generate a copy of at least a portion of the electronic design, the at least one processor further configured to connect all inputs except a loop cut input net associated with the removed section and to analyze a loop output net using formal verification.

16. The system of claim 15, wherein generating the copy includes generating two copies.

17. The system of claim 15, wherein analyzing is based upon, at least in part, a miter.

18. The system of claim 15, wherein if analyzing is successful an oscillating loop is detected.

19. The system of claim 15, wherein if analyzing is unsuccessful a false loop or stable loop is detected.

20. The system of claim 17, wherein analyzing includes checking for a miter value.

* * * * *